(12) United States Patent
Taniguchi

(10) Patent No.: US 6,878,945 B1
(45) Date of Patent: Apr. 12, 2005

(54) VAPORIZER FOR ION SOURCE

(75) Inventor: Kazuhiro Taniguchi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/759,095

(22) Filed: Jan. 20, 2004

(30) Foreign Application Priority Data

Sep. 19, 2003 (JP) .................................... 2003-327241

(51) Int. Cl.$^7$ ............................................. H01J 27/00
(52) U.S. Cl. ................... 250/425; 250/423 R; 250/424; 315/111.81
(58) Field of Search ............................ 250/423 R, 424, 250/425, 492.21; 315/111.81

(56) References Cited

U.S. PATENT DOCUMENTS

| | | | |
|---|---|---|---|
| 4,672,210 A | | 6/1987 | Armstrong et al. |
| 4,844,006 A | * | 7/1989 | Page et al. .................. 118/719 |
| 4,908,243 A | * | 3/1990 | Page et al. .................. 427/445 |
| 5,322,710 A | * | 6/1994 | Visser ...................... 427/248.1 |
| 5,356,477 A | * | 10/1994 | Visser ........................ 118/726 |
| 6,107,634 A | * | 8/2000 | Horsky .................... 250/423 R |
| 6,288,403 B1 | * | 9/2001 | Horsky et al. ............... 250/427 |
| 6,593,580 B2 | * | 7/2003 | Miyabayashi ................ 250/425 |
| 2001/0054384 A1 | | 12/2001 | Povall et al. |
| 2001/0054699 A1 | * | 12/2001 | Horsky et al. ............ 250/492.3 |
| 2002/0070672 A1 | * | 6/2002 | Horsky ................... 315/111.81 |
| 2002/0153493 A1 | * | 10/2002 | Miyabayashi ................ 250/425 |
| 2003/0030010 A1 | * | 2/2003 | Perel et al. .................. 250/424 |

FOREIGN PATENT DOCUMENTS

| | | |
|---|---|---|
| JP | 07-320671 | 12/1995 |
| JP | 2002-100298 | 4/2002 |

* cited by examiner

Primary Examiner—John R. Lee
Assistant Examiner—Johnnie L Smith, II
(74) Attorney, Agent, or Firm—Volentine Francos & Whitt, PLLC

(57) ABSTRACT

A vaporizer is provided for delivering a solid source, such as arsenic for example that is vaporized in a crucible, into an arc chamber through a nozzle. The vaporizer includes a nozzle formed with a gas inlet port formed in upward orientation and located downward from the upper end of the inner surface of the crucible. Here, when the crucible has an inner diameter of 26 mm for example, the gas inlet port is preferably formed at a position approximately 1.1 mm below the upper end of the inner surface of the crucible, thereby facilitating the introduction of the gas from the gas inlet port and preventing clogging of the nozzle.

7 Claims, 4 Drawing Sheets

FIG. 5

| L (mm) | HEATER TEMPERATURE (°C) | BEAM CURRENT (mA) | NOTES |
|---|---|---|---|
| 0 | 368 | 7.24 | ARSENIC BURNED ON BACK SURFACE OF NOZZLE |
| 0.6 | 312 | 8.42 | THOUGH BEAM AMOUNT IS STABLE UPON INITIATION, BEAM CURRENT IS NOT STABLE AS THE AMOUNT OF ARSENIC IN CRUCIBLE IS DECREASED. |
| 1.0 | 318 | 8.16 | STABLE BEAM CURRENT |
| 1.1 | 318 | 8.96 | STABLE BEAM CURRENT |
| 1.4 | 307 | 10.00 | INSTABLE BEAM CURRENT |

FIG. 6A
FIG. 6B
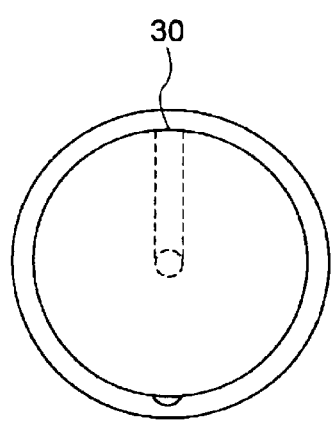
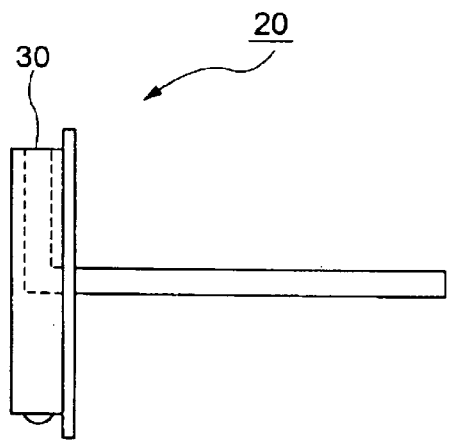

VAPORIZER FOR ION SOURCE

BACKGROUND OF THE INVENTION

1. Field of the Invention

The present invention relates to a vaporizer (vaporized gas generating oven) for an ion source which is used for ionizing a solid source in an ion implantation apparatus.

2. Description of the Related Art

In the manufacturing of semiconductor wafers, an ion implantation apparatus ionizes impurity atoms, accelerates the ions at high energy for implantation into a semiconductor to dope the impurities thereinto.

The ionization of impurity atoms may employ a solid source and a gaseous source. Generally, the ionization of a solid source involves placing the solid source in a crucible or a melting pot within a vaporizer of an ion source station, heating the solid source with a heater for vaporization, delivering the vaporized source into an arc chamber of the ion source station through a nozzle having a gas inlet port formed in the crucible, and ionizing the vaporized source by a plasma in the arc chamber.

The solid source placed in the vaporizer, for example, arsenic (As) is heated to approximately 370° C. in vacuum with a heater for vaporization. The vaporized As is delivered into the arc chamber through the nozzle by a pressure difference between vacuum conditions in the crucible of the vaporizer and in the arc chamber.

Japanese Patent Application Kokai No. 07-320671 shows a method of rapidly vaporizing a solid source using a microwave. Japanese Patent Application Kokai No. 2002-100298 in turn shows a method which enables rapid cooling for switching one source to another by providing a cooling duct spirally wound around a vaporizer.

However, when a solid source having a heavy mass, for example, solid As, is used, a desired amount of gas cannot be introduced into an arc chamber according to vacuum conditions in an ion source station, even if the solid source is heated in the vaporizer and vaporized, resulting in large variations in the amount of vaporized As.

Therefore, As must be vaporized more than a required vapor pressure in some cases for ionizing the gas introduced into the arc chamber to generate an ion beam required for implantation. In this event, there was a problem that As not introduced into the arc chamber is solidified and sticks around the nozzle, causing clogging of the nozzle and burn-in.

SUMMARY OF THE INVENTION

The present invention has been made in view of the problem mentioned above, and it is an object of the present invention to provide a novel and improved vaporizer for an ion source which does not need to vaporize a solid source more than an amount necessary for generating an ion beam to prevent clogging of a nozzle, and burn-in.

To solve the above-described problems, according to one aspect of the present invention, there is provided a vaporizer for delivering a solid source vaporized in a crucible into an arc chamber through a nozzle, which comprises a nozzle having a gas inlet port formed in upward orientation, the gas inlet port being located a predetermined distance downward from an upper end of an inner surface of a crucible.

Here, when the crucible has an inner diameter of, for example, 26 mm, the gas inlet port is preferably formed at a distance approximately 1.1 mm below the upper end of the inner surface of the crucible, thereby facilitating efficient introduction of the gas from the gas inlet port. The nozzle in this structure is more effective in increasing the amount of introduced gas as a solid source has a heavier mass, and can be applied, for example, to an arsenic solid source.

By thus facilitating the introduction of the gas, the heater temperature can be lowered from approximately 370° C., as conventionally employed, to approximately 320° C. to 350° C. for vaporizing a solid source in the crucible to provide a desired gas concentration in the arc chamber, thereby achieving stable ionization.

To solve the foregoing problem, according to another aspect of the present invention, there is provided a vaporizer for an ion source which comprises a nozzle having a plurality of gas inlet ports for introducing a solid source vaporized in a crucible of the vaporizer, formed in an upper portion of the crucible.

The plurality of gas inlet ports are preferably two gas inlet ports. The nozzle is branched from the center of the crucible such that the two gas inlet ports are symmetrically formed at approximately 45 degrees to the vertical central axis of the crucible, thereby enabling effective introduction of a gas.

As described above in detail, according to the vaporizer for an ion source of the present invention, the improved shape of the nozzle facilitates the introduction of a vaporized source gas from the vaporizer to the arc chamber, and eliminates clogging of the nozzle and burn-in. Also, the facilitated and improved introduction of the gas can lead to a lower heater temperature in the vaporizer than before, thus achieving stable ionization.

BRIEF DESCRIPTION OF THE DRAWINGS

FIG. 1A is a front view, and FIG. 1B is a side view;

FIG. 3A is a front view, and FIG. 3B is a side view;

FIG. 5 is an explanatory diagram showing the result of an experiment in the first embodiment; and FIGS. 6A and 6B are schematic diagrams showing a conventional nozzle, where FIG. 6A is a front view, and FIG. 6B is a side view.

DETAILED DESCRIPTION OF THE INVENTION

Figure 1A:
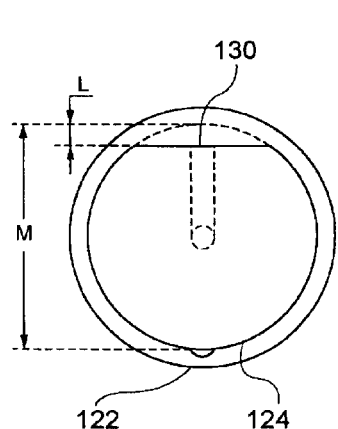
FIGS. 1A and 1B are schematic diagrams each showing a nozzle according to a first embodiment, where

A vaporizer for an ion source according to the embodiments of the present invention will hereinafter be described in detail with reference to the accompanying drawings. In the specification and drawings, components having substantially the same functional configurations are designated the same reference numerals, and repeated description thereon is omitted.

First Embodiment

Figure 1B:
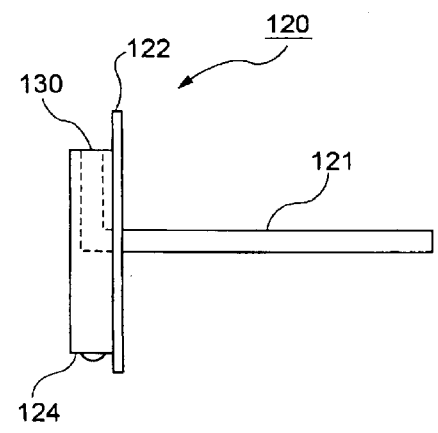

FIGS. 1A and 1B are explanatory diagrams each schematically showing the configuration of a nozzle 120 of a vaporizer according to a first embodiment, where FIG. 1A is a front view, and FIG. 1B is a side view. A gas inlet port 130 for introducing a vaporized gas through a gas feed pipe 121 is formed in upward orientation in a body 124 of a crucible formed with a flange 122 and sealed by the flange 122.

Here, an upper portion of the body 124 is cut such that the distance from the upper end of the crucible to the gas inlet port 130 has a predetermined length L, and the gas inlet port 130 is offset downward from the conventional position to be closer to the center of the crucible.

Figure 2:
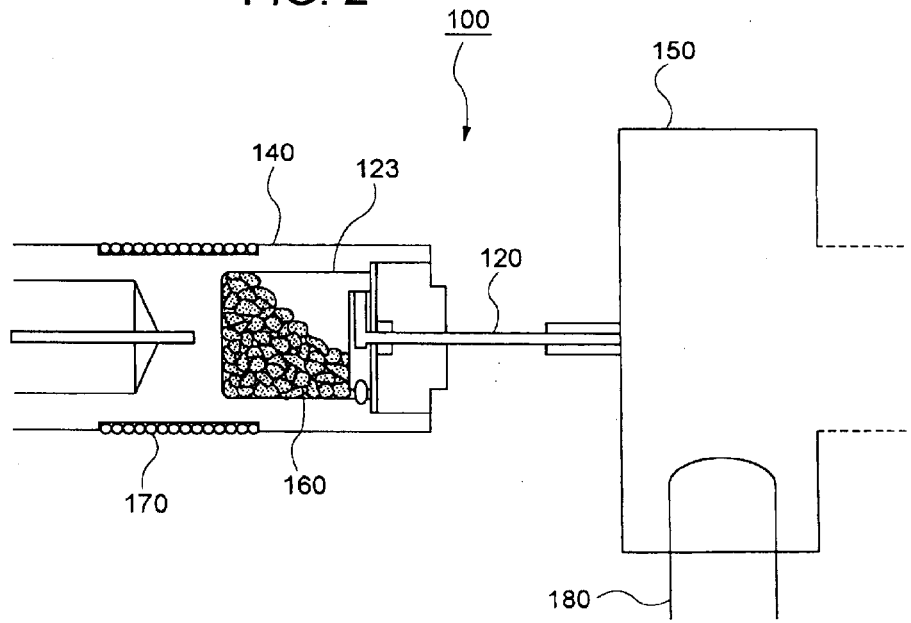
FIG. 2 is an explanatory diagram schematically showing an overall ion source station to which the first embodiment is applied.

FIG. 2 is a diagram showing the configuration of an ion source station 100 which has the nozzle 120 of the first embodiment attached thereto. A solid source 160 having a relatively heavy mass, placed in the crucible 123 of a vaporizer 140, for example, arsenic (As) is heated in vacuum with a heater 170 to be vaporized.

The vaporized As is delivered into an arc chamber 150 through the nozzle 120 of the first embodiment by a pressure difference between the crucible 123 of the vaporizer 140 and an arc chamber 150, ionized by a filament 180 to generate an ion beam which is extracted from the arc chamber 150. The As vaporized in the crucible 123 easily passes through a wider spacing or distance between the upper end of the crucible 123 and the gas inlet port 130, because of the gas inlet port 130 attached at a position lower than that of the gas inlet port 30 of the conventional nozzle 20 shown in FIGS. 6A and 6B, so that the vaporized gas can be readily delivered into the arc chamber 150 even with a smaller pressure difference than that of conventional case.

The gas inlet port is provided in an upper portion of the crucible because the crucible is filled with the vaporized solid source so that the gas can be stably introduced from the gas inlet port. If the gas inlet port is provided at an excessively low position, the vaporized solid source passes too fast and therefore tends to be affected by the temperature of the vaporizer, the degree of vacuum in the crucible, and the like, resulting in an unstable amount of beam. While the conventional nozzle has the gas inlet port provided in an upper portion of the crucible, the gap between the upper end of the crucible and gas introducing port is extremely small with respect to the inner diameter of the crucible.

The pressure difference between the crucible 123 and arc chamber 150 represents the amount of As vaporized in the crucible 123 with respect to the degree of vacuum in the ion source station 100. Since the amount of vaporized As increases as the As is heated at higher temperatures with the heater 170 to cause a higher positive pressure, the requirement for a smaller pressure difference means that the heater 170 can be set at a temperature lower than the conventional temperature, i.e., approximately 370° C. Of course, even though a smaller pressure difference is sufficient, a positive pressure minimally required for delivering the gas into the arc chamber 150 should be ensured for supplying a stable amount of gas into the arc chamber 150.

In this regard, an experiment was made on the heater temperature of the vaporizer, a beam current of the ion beam generated in the arc chamber, the stability of the beam current, and the like with respect to the distance between the upper end of the crucible (having an inner diameter M of 26 mm) and the gas inlet port of the nozzle to consider an optimal cut surface and a temperature condition. FIG. 5 shows the result of the experiment.

It is understood from FIG. 5 that while the beam current is stable when L is 1 mm and 1.1 mm, a larger beam current can be generated with 1.1 mm. In regard to how the used nozzle is smudged, less smudge caused by the sticking source is found when L is 1.1 mm. When L is 1.0 mm, the temperature is stable from the initiation to the end (until the source is replaced), but the nozzle is burned in. When L is increased to 1.4 mm, the beam current at the initiation as well as the heater temperature are in good conditions, but the beam current decreases and becomes instable over time.

It is understood from the foregoing result that the distance L between the upper end of the crucible having the inner diameter of 26 mm and the gas inlet port, i.e, the length by which the body is cut, is preferably 1.1 mm. Also, the heater temperature of the vaporizer for ensuring a required ion beam current can be in a range of 320° C. to 350° C. though it varies depending on the amount of the solid As remaining in the crucible.

Thus, in the first embodiment, the increased distance from the upper end of the inner surface of the crucible to the gas inlet port of the nozzle facilitates the introduction of a gas into the arc chamber, and enables stable ionization of a source at a lower gas vapor pressure than before, without giving rise to troubles such as clogging of the nozzle.

Second Embodiment

Figure 3A:
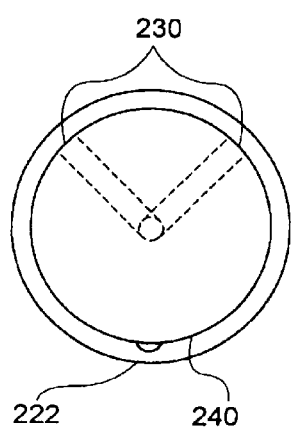
FIGS. 3A and 3B are schematic diagrams showing a nozzle according to a second embodiment, where
Figure 3B:
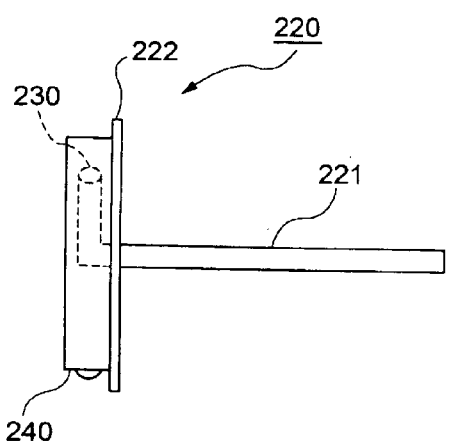

FIGS. 3A and 3B are schematic diagrams showing the configuration of a nozzle 220 of a vaporizer according to a second embodiment. A plurality of gas inlet ports 230, for example, two gas inlet ports 230 are formed in upward orientation on a body 224 of a crucible sealed by a flange 222 for introducing a vaporized gas from a gas feed pipe 221 of the nozzle 220. The remaining configuration of the ion source station except for the components associated with the nozzle 220 is similar to that of the first embodiment, so that description thereon is omitted.

A heavy solid source, for example As, vaporized in the crucible can be readily introduced into the arc chamber even with a small pressure difference between the crucible and arc chamber by virtue of the two gas inlet ports 230 of the nozzle 220 which introduce an increased amount of gas in the crucible. While three gas inlet ports 230 may be provided, the vaporized solid source passes therethrough too fast and therefore tends to be affected by the temperature of the vaporizer, the degree of vacuum in the crucible, and the like, possibly resulting in an unstable beam current.

Figure 4:
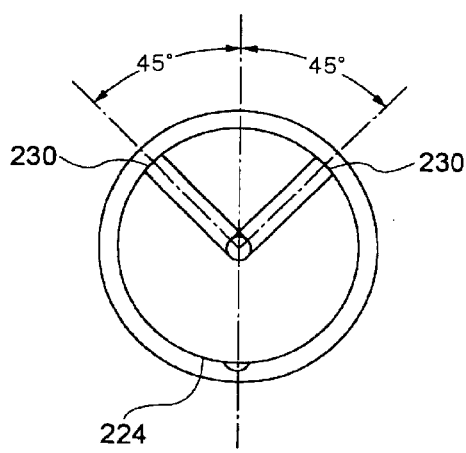
FIG. 4 is an explanatory diagram showing the position at which a gas inlet port is formed in the second embodiment.

In regard to the angle formed by the two gas inlet ports of the nozzle, an experiment was made on the heater temperature of the vaporizer, a beam current of the ion beam generated in the arc chamber, the stability of the beam current, and the like to consider an optimal angle. As a result, it has been revealed that the gas inlet ports are desirably provided at an angle of 45 degrees symmetrically to the vertical center line of the crucible from the peak of the nozzle positioned at the center of the crucible, as shown in the front view of the nozzle in FIG. 4.

As is the case with the first embodiment, the pressure difference between the vaporizer and arc chamber corresponds to the amount of As vaporized in the crucible of the vaporizer with respect to the degree of vacuum in the ion source station. Since the amount of vaporized As increases as the As is heated at higher temperatures with the heater to cause a higher positive pressure, the temperature of the heater can be lowered to form 320° C. to 350° C. (varying depending on the amount of remaining solid As) from the conventional temperature, i.e., approximately 370° C. Like the first embodiment, even though a smaller pressure difference is sufficient, a minimally required positive pressure must be ensured.

Thus, in the second embodiment, the Increased number of gas inlet ports of the nozzle facilitate the introduction of a gas into the arc chamber, and enables stable ionization of a source at a lower vapor pressure of the gas than before, without giving rise to troubles such as clogging of the nozzle.

While the preferred embodiments of the present invention have been described with reference to the accompanying drawings, it should be understood that the present invention is not limited to such embodiments. It will be apparent to those skilled in the art that a variety of alterations and modifications can be made without departing from the scope of the invention as set forth in the claims, and that they also fall under the scope of the present invention.

While the foregoing embodiments have been described using arsenic as a solid source, the present invention can be applied to any other solid source having a heavy mass, for example, antimony and the like.

The present invention can be applied to an ion implantation apparatus installed in a semiconductor manufacturing apparatus and the like, and particularly to a vaporizer for an ion source for introducing through a nozzle a solid source gas vaporized in the vaporizer into an arc chamber for ionizing the gas.

This application is based on Japanese Patent Application No. 2003-327241 which is hereby incorporated by reference.

What is claimed is:

1. A vaporizer for vaporizing a solid source to deliver the vaporized source into an ionization chamber of an ion implantation apparatus, comprising:

a nozzle having a gas inlet port formed in upward orientation, said gas inlet port being located a predetermined distance downward from an upper end of an inner surface of a crucible for vaporizing the solid source therein, said predetermined distance being determined so that the vaporized source is delivered from the crucible to the ionization chamber through the gas inlet port of the nozzle even though a pressure difference between the crucible and the ionization chamber is small.

2. A vaporizer according to claim 1, wherein said predetermined distance of said gas inlet port from the upper end of the inner surface of crucible is approximately 1.1 mm when the crucible has an inner diameter of 26 mm.

3. A vaporizer according to claim 1, wherein said solid source is arsenic.

4. A vaporizer for vaporizing a solid source to deliver the vaporized source into an ionization chamber an ion implantation apparatus, comprising:

a nozzle having a plurality of gas inlet ports formed in an upper portion of a crucible for vaporizing the solid source therein, the number of the gas inlet ports being determined so that the vaporized source is delivered from the crucible to the ionization chamber through the gas inlet ports of the nozzle even though a pressure difference between the crucible and the ionization chamber is small.

5. A vaporizer according to claim 4, wherein the number of the gas inlet ports is two.

6. A vaporizer according to claim 5, wherein the nozzle includes the two gas inlet ports branched from a center of the crucible such that the two gas inlet ports are symmetrically formed at approximately 45 degrees to a vertical central axis of the crucible.

7. A vaporizer according to claim 4, wherein said solid source is arsenic.

* * * * *